(12) United States Patent
Tsunekawa (10) Patent No.: US 8,037,597 B2
(45) Date of Patent: Oct. 18, 2011

(54) MANUFACTURING METHOD OF TAPE CARRIER FOR TAB

(75) Inventor: Makoto Tsunekawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 807 days.

(21) Appl. No.: 12/062,573

(22) Filed: Apr. 4, 2008

(65) Prior Publication Data

US 2008/0244901 A1   Oct. 9, 2008

(30) Foreign Application Priority Data

Apr. 9, 2007  (JP) ................................. 2007-101287

(51) Int. Cl.
  *H01K 3/00* (2006.01)
(52) U.S. Cl. .............................. 29/849; 29/846; 174/255
(58) Field of Classification Search .................. 174/254, 174/255, 117 F; 257/666, 687; 355/53; 430/315; 438/107; 29/827, 846–849
See application file for complete search history.

(56) References Cited

U.S. PATENT DOCUMENTS

| | | | | |
|---|---|---|---|---|
| 4,049,903 A * | 9/1977 | Kobler | ............................ | 29/827 |
| 4,411,982 A * | 10/1983 | Shibuya et al. | ................. | 29/846 |
| 4,980,219 A | 12/1990 | Hiraide et al. | | |
| 5,019,209 A | 5/1991 | Hiraide et al. | | |
| 5,198,857 A | 3/1993 | Goto | | |
| 6,200,824 B1 * | 3/2001 | Hashimoto | ................... | 257/666 |

FOREIGN PATENT DOCUMENTS

| | | |
|---|---|---|
| JP | 01256138 A | 10/1989 |
| JP | 2886675 B2 | 4/1999 |
| JP | 2002-299390 A | 10/2002 |
| JP | 2002299390 A | 10/2002 |
| JP | 2007073863 A | 3/2007 |

* cited by examiner

*Primary Examiner* — Donghai D. Nguyen
(74) *Attorney, Agent, or Firm* — Panitch Schwarze Belisario & Nadel LLP (57) ABSTRACT

Positioning marks are formed on both sides of each printing block on a tape carrier for TAB. A long-sized circuit board is transported by a roll-to-roll system in screen printing. When an optical sensor detects a positioning mark, transportation of the long-sized circuit board is stopped. Thereafter, the screen printing of a solder resist is performed to the printing block of the long-sized circuit board by a screen printing device.

5 Claims, 9 Drawing Sheets

MANUFACTURING METHOD OF TAPE CARRIER FOR TAB

BACKGROUND OF THE INVENTION

1. Field of the Invention

The present invention relates to a manufacturing method of a tape carrier for TAB.

2. Description of the Background Art

As a manufacturing method of a printed circuit board, a TAB (Tape Automated Bonding) technique is known. In this TAB technique, a plurality of mounting parts are provided at equal intervals on a long-sized tape carrier (a long-sized tape board). Wiring patterns are formed in each mounting part, and a solder resist is formed in a predetermined region of the wiring patterns. Then, electrodes of an electronic component is bonded to each of the plurality of mounting parts formed on the tape carrier. In this way, the electronic component is mounted on each of the plurality of mounting parts on the tape carrier.

Normally, the solder resists are formed in the predetermined regions of the respective wiring patterns by screen printing while the tape carrier is transported by a roll-to-roll system in a step of forming the solder resists on the tape carrier. In this case, the screen printing is performed for each block composed of the mounting parts with a predetermined number depending on a size of a printing stage.

Meanwhile, it is desired that the intervals between the plurality of mounting parts aligning at the equal intervals are minimized in order to efficiently use a material for the tape carrier.

When the intervals between the mounting parts on the tape carrier are small, however, slight shifts in printing positions of the solder resists may generate printing defects such as deficient print in the mounting parts positioned on edges of each block.

JP 2002-299390 A describes a method for positioning and fixing a film carrier tape (a tape carrier) in the printing of the solder resist in order to improve printing precision of the solder resist. In the method of JP 2002-299390 A, positioning holes are formed on both edge portions in a width direction of the film carrier tape by punching or a laser. Positioning pins of a positioning jig are inserted into the positioning holes in a step of applying the solder resist, so that the film carrier tape is positioned and fixed.

According to the method of JP 2002-299390 A, however, a step for forming the positioning holes in the film carrier tape is required before the step of applying the solder resist. In addition, a step of inserting the positioning pins of the positioning jig into the positioning holes is required between the step of forming the positioning holes and the step of applying the solder resist.

Moreover, distances between respective lateral sides of the film carrier tape and the positioning holes are required to be large so that regions between the positioning holes of the film carrier tape and the respective lateral sides thereof are not damaged when the positioning pins of the positioning jig are inserted into the positioning holes. In addition, the positioning holes are required to be formed in such size that the positioning pin can be inserted. This causes useless regions in both side portions of the film carrier tape to be large.

SUMMARY OF THE INVENTION

An object of the present invention is to provide a manufacturing method of a tape carrier for TAB capable of performing screen printing of a solder resist with a high precision while suppressing an increase in the number of processes and waste of a material.

(1) According to an aspect of the present invention, a manufacturing method of a tape carrier for TAB includes the steps of forming along-sized circuit board by forming a plurality of mounting parts each including a wiring pattern on a long-sized insulating layer and forming a solder resist in a predetermined region of the wiring pattern in each of the mounting parts for each unit region including a predetermined number of mounting parts of the long-sized circuit board by using a screen printing device while transporting the long-sized circuit board by a roll-to-roll system, wherein the step of forming the long-sized circuit board includes a step of forming a positioning mark, corresponding to each unit region, in a region along at least one lateral side in a longitudinal direction on the long-sized circuit board, the step of forming the solder resist includes a step of detecting that the unit region corresponding to the positioning mark is positioned in a region where the screen printing device can make prints by detection of the positioning mark during transportation of the long-sized circuit board, a step of stopping the transportation of the long-sized circuit board in response to the detection of the positioning mark, a step of performing screen printing of the solder resist by the screen printing device to the unit region corresponding to the positioning mark in the long-sized circuit board that has been stopped, and a step of resuming the transportation of the long-sized circuit board after the screen printing.

In the manufacturing method of the tape carrier for TAB, first, the plurality of mounting parts each including the wiring pattern are formed on the long-sized insulating layer, so that the long-sized circuit board is formed. Next, the solder resist is formed in a predetermined region of the wiring pattern in each mounting part for each unit region including a predetermined number of mounting parts of the long-sized circuit board by using the screen printing device while the long-sized circuit board is transported by the roll-to-roll system.

In the step of forming the long-sized circuit board, the positioning mark corresponding to each unit region is formed in the region along at least one lateral side in the longitudinal direction on the long-sized circuit board. In the step of forming the solder resist, the positioning mark is detected in the transportation of the long-sized circuit board, so that it is detected that the unit region corresponding to the positioning mark is positioned in the region where the screen printing device can make prints. The screen printing of the solder resist is performed by the screen printing device to the unit region corresponding to the positioning mark in the long-sized circuit board that has been stopped. The transportation of the long-sized circuit board is resumed after the screen printing.

In this way, the screen printing of the solder resist is performed to the plurality of mounting parts in each unit region while the unit region of the long-sized circuit board is accurately positioned in the region where the screen printing device can make prints.

In this case, since the positioning mark is formed in the step of forming the long-sized circuit board, an increase in the number of the steps caused by forming the positioning mark is suppressed. In addition, since the positioning mark is used for detecting whether or not the unit region corresponding thereto is positioned in the region where the screen printing device can make prints, the positioning mark can be formed in small size. This allows an area of the region where the positioning mark is formed to be small, so that waste of a material is suppressed.

As a result of these, the screen printing of the solder resist can be performed with high precision while the increase in the number of the steps and the waste of the material is suppressed in the manufacture of the tape carrier for TAB.

(2) The step of forming the positioning mark may include providing each positioning mark on at least one side of each unit region in a width direction of the long-sized circuit board.

In this case, when the positioning mark is positioned close to the region where the screen printing device can make prints, the unit region of the long-sized circuit board is positioned in the region where the screen printing device can make prints. The detection of the positioning mark in the vicinity of the screen printing device allows the unit region of the long-sized circuit board to be positioned in the region, in which prints can be made, of the screen printing device. Thus, a detector for detecting the positioning mark is easily positioned.

(3) The screen printing device may include a printing stage set at a back surface of the insulating layer of the long-sized circuit board and a screen plate set at a surface on a side of the plurality of mounting parts of the long-sized circuit board to be opposite to the printing stage with the long-sized circuit board sandwiched between the printing stage and the screen plate, and the step of forming the positioning mark may include providing each positioning mark such that the unit region corresponding to the positioning mark is positioned below the screen plate when the positioning mark is positioned at a predetermined portion of the printing stage in the transportation direction of the long-sized circuit board.

In this case, the detection of the positioning mark positioned at the predetermined portion of the printing stage in the transportation direction of the long-sized circuit board is performed, so that it can be detected that the unit region corresponding to the positioning mark is positioned below the screen plate. This allows each unit region of the long-sized circuit board to be more accurately and easily positioned below the screen plate.

(4) The predetermined portion may be at least one of a front end and a rear end of the printing stage. In this case, the detection of the positioning mark positioned on at least one of the front end and the rear end of the printing stage in the transportation direction of the long-sized circuit board is performed, so that it can be detected that the unit region corresponding to the positioning mark is positioned below the screen plate. This allows each unit region of the long-sized circuit board to be further accurately and easily positioned below the screen plate.

(5) The step of detecting may include optically detecting each positioning mark. In this case, the positioning mark can be accurately detected even though the positioning mark is small in size. This allows each unit region of the long-sized circuit board to be more accurately and easily positioned in the region where the screen printing device can make prints.

(6) The step of forming the long-sized circuit board may include simultaneously forming the wiring pattern and the positioning mark that are composed of a conductor layer on the insulating layer.

In this case, the positioning mark can be easily formed in the long-sized circuit board without increasing the number of the manufacturing steps of the tape carrier for TAB. In addition, since the positioning mark is composed of the conductor layer, the positioning mark can be easily detected by reflection of light.

According to the present invention, the screen printing of the solder resist can be performed with high precision while the increase in the number of the steps and the waste of the material can be suppressed in the manufacture of the tape carrier for TAB.

Other features, elements, characteristics, and advantages of the present invention will become more apparent from the following description of preferred embodiments of the present invention with reference to the attached drawings.

DESCRIPTION OF THE PREFERRED EMBODIMENTS

A tape carrier for TAB and a method for manufacturing the same according to an embodiment of the present invention will now be described.

(1) Basic Configuration of the Tape Carrier for TAB

Figure 1:
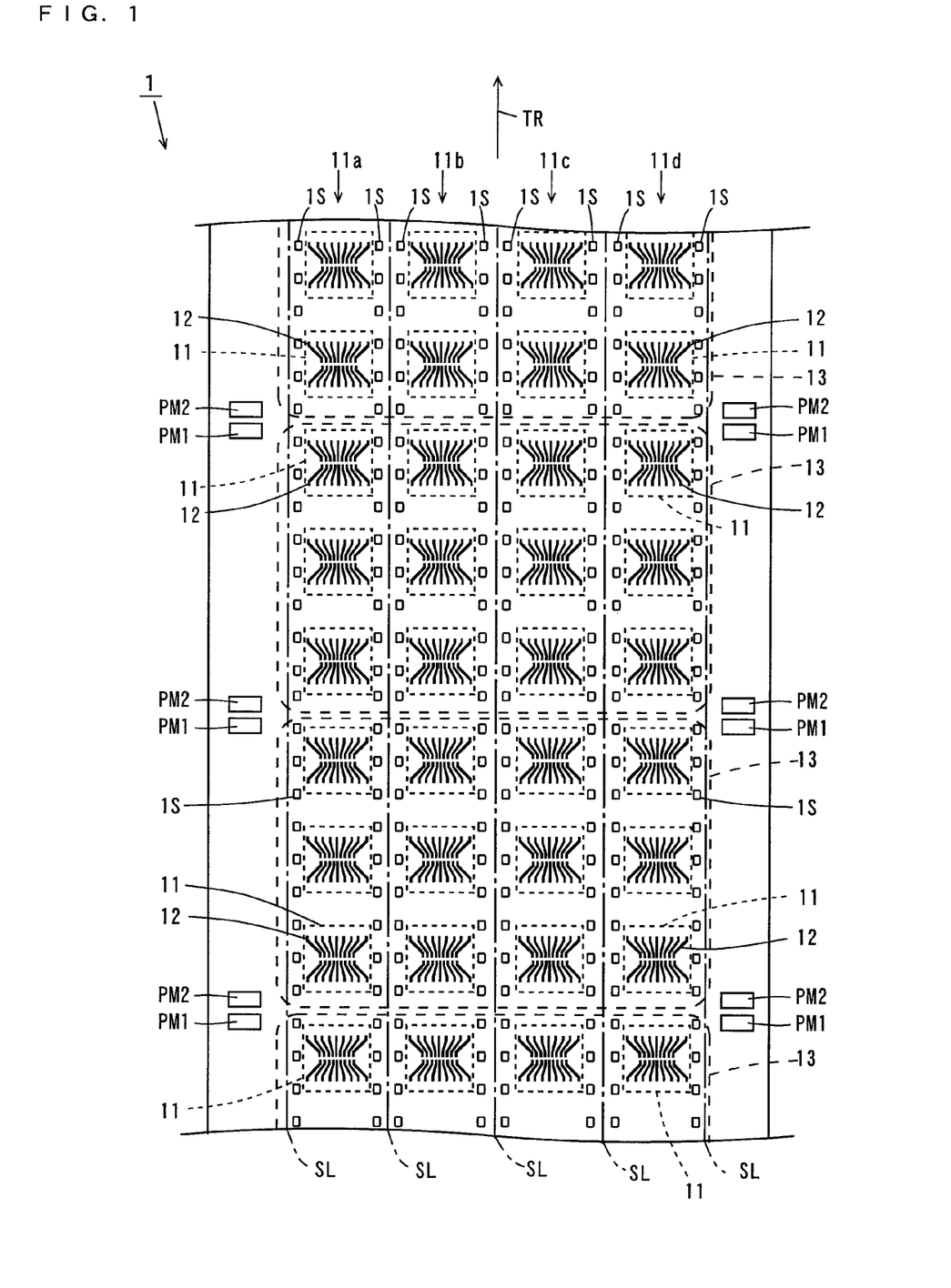
FIG. 1 is a plan view of a tape carrier for TAB according to an embodiment of the present invention.

FIG. 1 is a plan view of the tape carrier for TAB according to the embodiment of the present invention.

In FIG. 1, a direction vertical to a longitudinal direction of the long-sized tape carrier 1 for TAB is referred to a width direction. This tape carrier 1 for TAB is manufactured while being transported in the longitudinal direction by a roll-to-roll system. In FIG. 1, the tape carrier 1 for TAB is transported in the transportation direction TR.

As shown in FIG. 1, a plurality of rectangular mounting parts 11 in which electronic components such as semiconductor chips are to be mounted are provided at predetermined intervals interposed therebetween in the width direction and the longitudinal direction, respectively, in the long-sized tape carrier 1 for TAB. The plurality of mounting parts 11 forms a plurality of (four in FIG. 1) rows 11a to 11d so as to extend in the longitudinal direction.

A plurality of square-shaped sprocket holes 1S are formed at predetermined intervals on both sides of each of the rows 11a to 11d along the longitudinal direction of the tape carrier 1. A plurality of wiring patterns 12 to which electrodes of an electronic component are bonded are formed in each mounting part 11.

A solder resist is formed in a predetermined region of each mounting part 11 by screen printing described later. In the present embodiment, the solder resists are formed by the screen printing for each region composed of the plurality of mounting parts 11. Hereinafter, a region where the solder resists are formed by one screen printing is referred to as a printing block 13. In the example of FIG. 1, each printing block 13 includes a total of twelve mounting parts 11 constituted by three mounting parts 11 each provided on the four rows. A plurality of printing blocks 13 are arranged in the longitudinal direction of the tape carrier 1 for TAB.

Quadrangular positioning marks PM1, PM2 are formed on both sides of each printing block 13 on the tape carrier 1 for TAB. The positioning marks PM1, PM2 are used for positioning each printing block 13 on the tape carrier 1 for TAB to a printing stage, described later, in the screen printing.

The positioning marks PM1 are provided in the vicinity of both lateral sides of the tape carrier 1 for TAB, respectively, so as to be adjacent to a front end of the printing block 13 in the transportation direction TR of the tape carrier 1 for TAB. Respective one sides on front end sides of the positioning marks PM1 and the front end of the printing block 13 are positioned in the same straight line in the width direction. In addition, the positioning marks PM2 are provided in the vicinity of the both lateral sides of the tape carrier 1 for TAB, respectively, so as to be adjacent to a rear end of the printing block 13 in the transportation direction TR of the tape carrier 1 for TAB. Respective one sides on rear end sides of the positioning marks PM2 and the rear end of the printing block 13 are positioned in the same straight line in the width direction.

In the present invention, the tape carrier 1 for TAB is used being divided into four tape carriers along slit lines SL indicated by the broken lines in FIG. 1. The electronic components are bonded to the respective mounting parts 11 of the divided tape carriers, which are then cut for each mounting part 11, so that electronic devices are completed.

(2) Configuration of the Mounting Part

Figure 2:
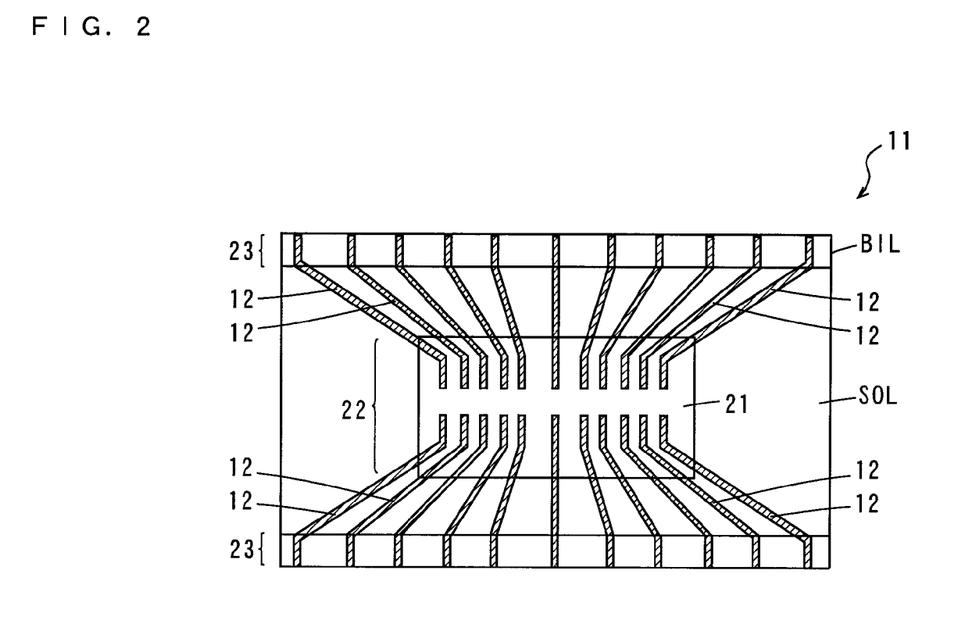
FIG. 2 is an enlarged plan view of a mounting part of a printed circuit board of FIG. 1.

The mounting part 11 of FIG. 1 will now be described more in detail. FIG. 2 is an enlarged plan view of the mounting part 11 of the tape carrier 1 for TAB shown in FIG. 1.

As shown in FIG. 2, a rectangular mounting region 21 is provided at the center of a base insulating layer BIL. An electronic component such as a semiconductor chip (not shown) is mounted on this mounting region 21. A region excluding the mounting region 21 is referred to as a non-mounting region.

The plurality of wiring patterns 12 are formed so as to extend from the inside of the mounting region 21 of the base insulating layer BIL to one side of the non-mounting region. In addition, the plurality of wiring patterns 12 are formed so as to extend from the inside of the mounting region 21 of the base insulating layer BIL to the other side of the non-mounting region.

A portion of the wiring patterns 12 in the mounting region 21 is referred to as an inner lead portion 22. Moreover, ends of the wiring patterns 12 in the non-mounting region are referred to as an outer lead portions 23.

A solder resist SOL is formed on the base insulating layer BIL excluding a region that includes the outer lead portions 23 on the both sides and the mounting region 21 so as to cover the wiring patterns 12. Accordingly, the inner lead portion 22 and the outer lead portions 23 of the wiring patterns 12 are exposed.

(3) Manufacturing Method of the Tape Carrier for TAB

Figure 3:
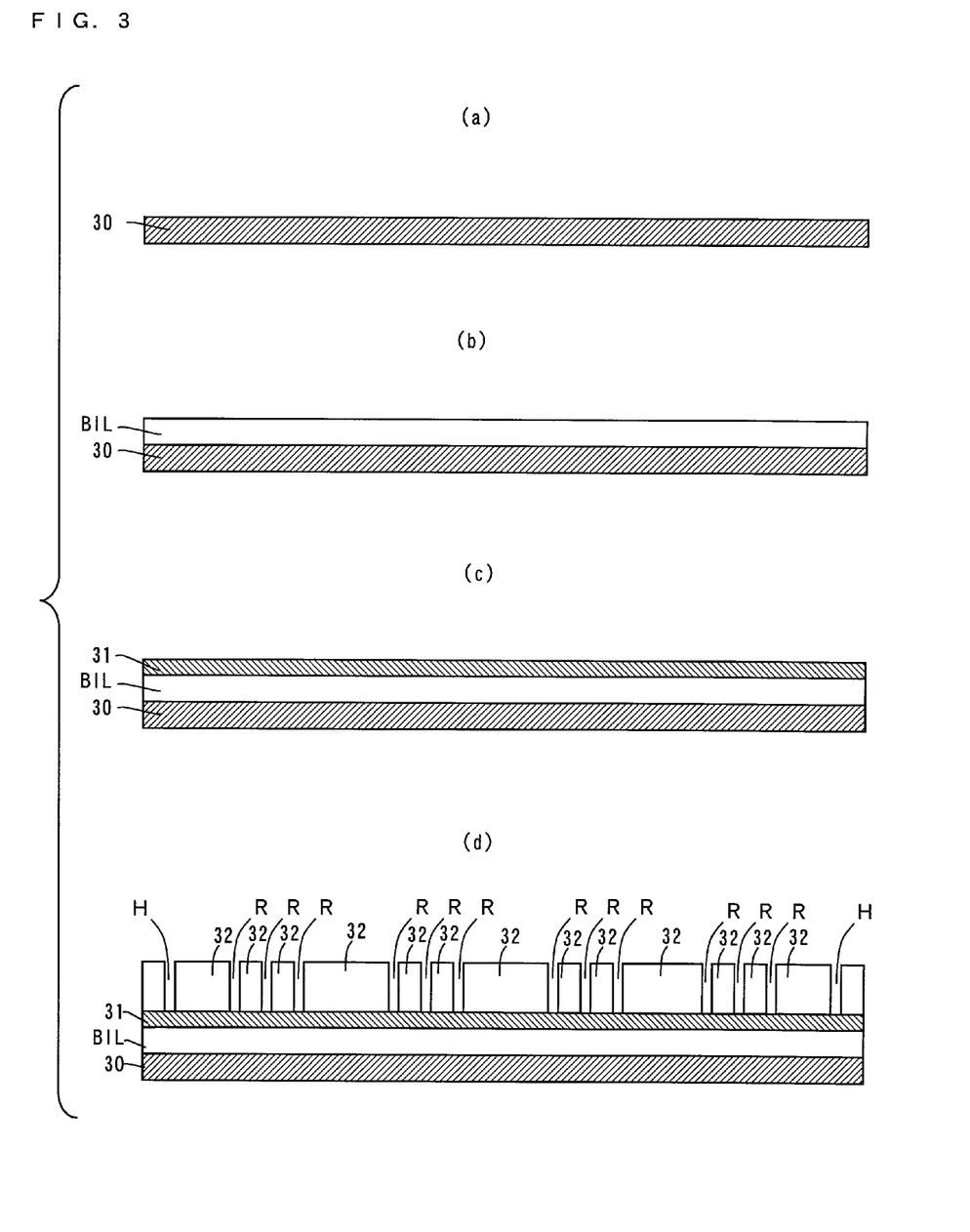
FIG. 3 is a manufacturing step diagram for use in explaining a manufacturing method of the tape carrier for TAB.
Figure 4:
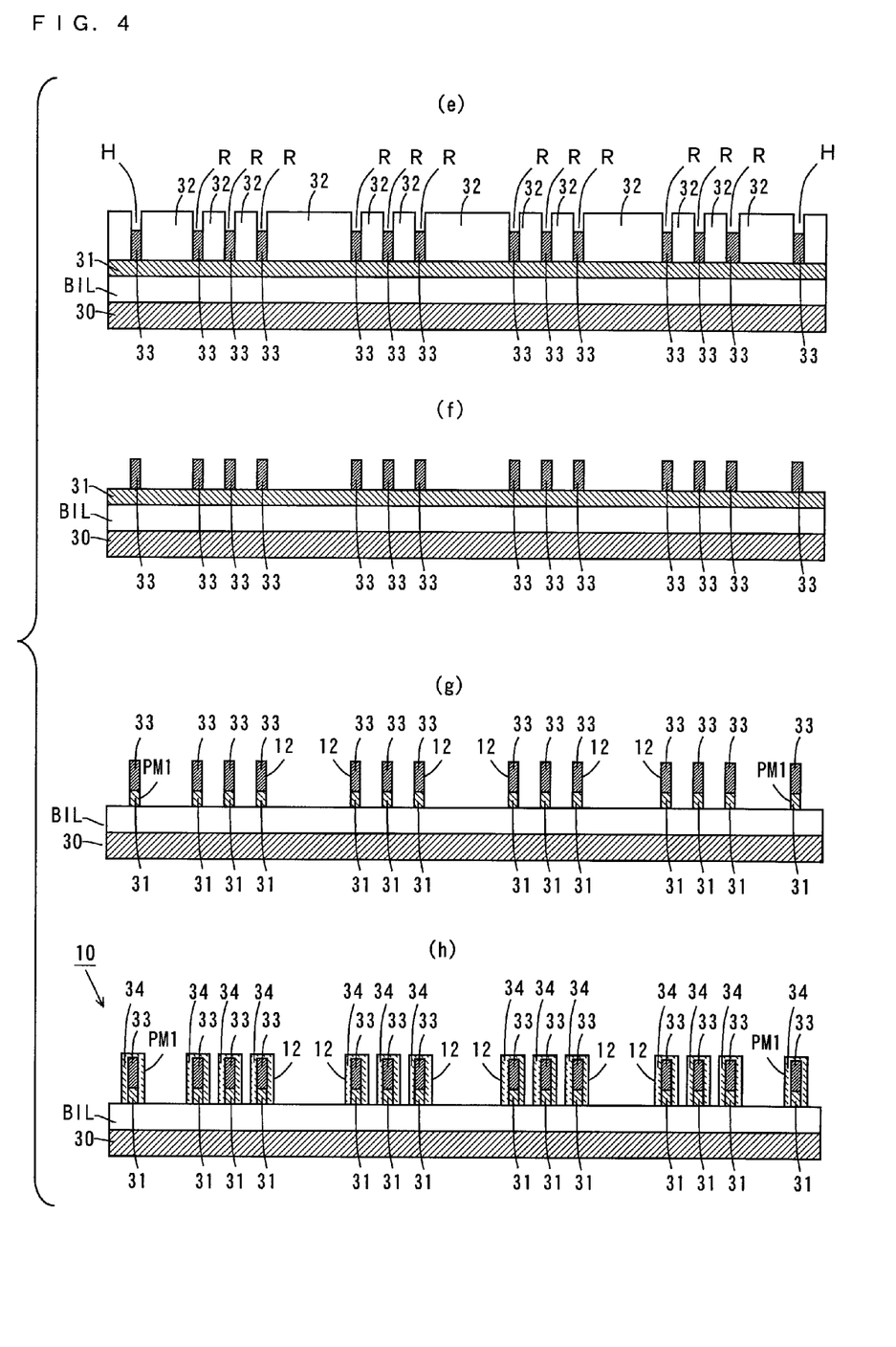
FIG. 4 is a manufacturing step diagram for use in explaining the manufacturing method of the tape carrier for TAB.
Figure 5:
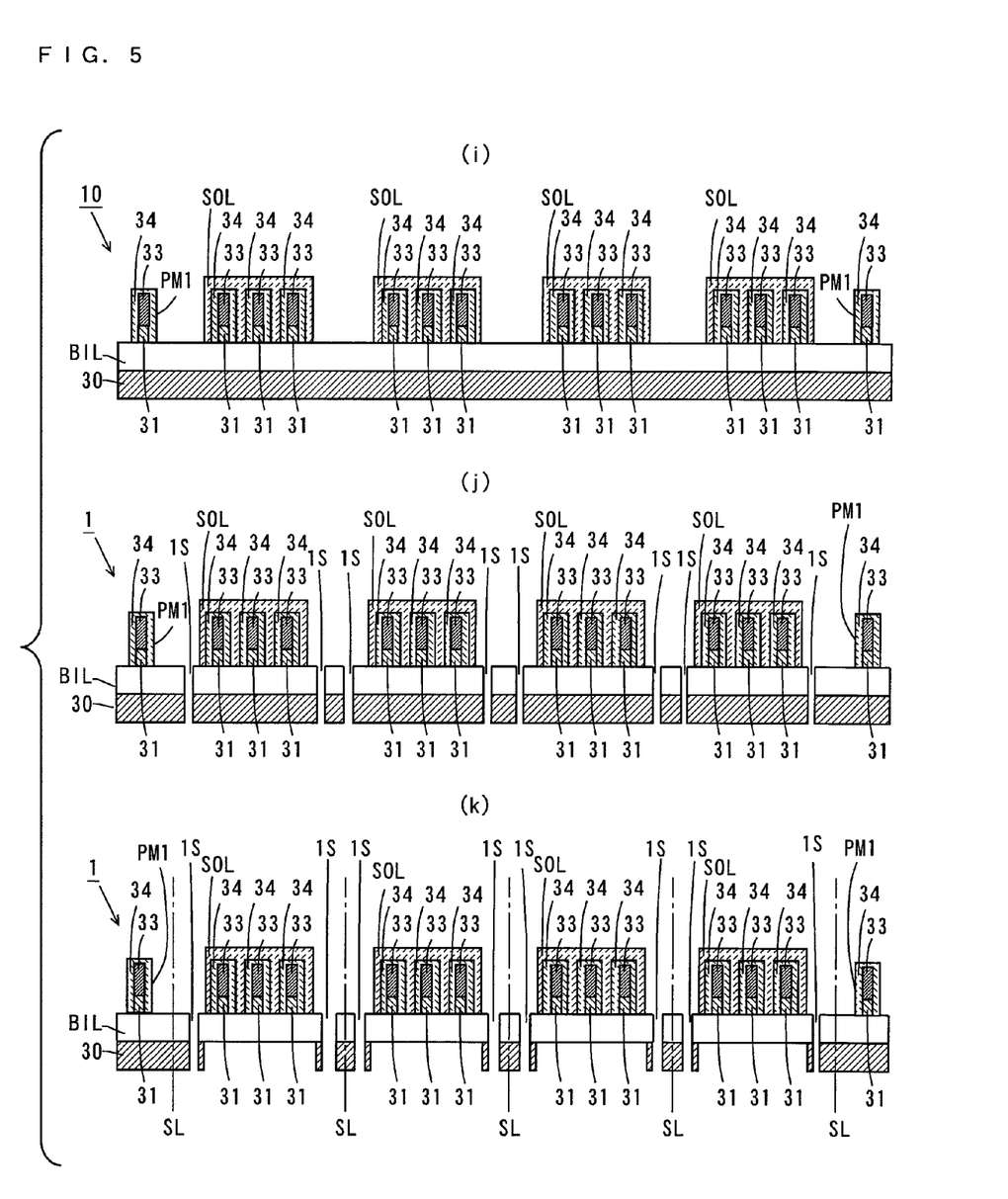
FIG. 5 is a manufacturing step diagram for use in explaining the manufacturing method of the tape carrier for TAB.

The manufacturing method of the tape carrier 1 for TAB by using a semi-additive method will now be described. FIGS. 3 to 5 are manufacturing step diagrams for explaining the manufacturing method of the tape carrier 1 for TAB.

First, a long-sized board 30, made of stainless steel, for example, is prepared as shown in FIG. 3(a).

Next, the base insulating layer BIL, made of polyimide, for example, is formed on the long-sized board 30 as shown in FIG. 3(b). The thickness of the base insulating layer BIL is preferably not less than 10 μm and not more than 100 μm, and is 25 μm in the present embodiment.

Then, a thin metal film 31, made of copper, for example, is formed on the base insulating layer BIL by sputtering as shown in FIG. 3(c). The thickness of the thin metal film 31 is preferably not less than 0.05 μm and not more than 1 μm, and is 0.1 μm in the present embodiment.

A plating resist 32 having grooves R and positioning mark formation holes H is subsequently formed on the thin metal film 31 as shown in FIG. 3(d). The grooves R have shapes corresponding to the wiring patterns 12 of FIG. 2, and the positioning mark formation holes H have a shape corresponding to the positioning marks PM1, PM2 of FIG. 1.

The plating resist 32 is formed, for example, by forming a resist film on the thin metal film 31 with a dry film resist or the like, exposing the resist film in a predetermined pattern and then developing the resist film.

Next, conductor layers 33 are formed in the grooves R on the thin metal film 31 and in the positioning mark formation holes H by electrolytic plating as shown in FIG. 4(e). Copper, for example, can be used as the conductor layers 33. The thickness of the conductor layers 33 is preferably not less than 5 μm and not more than 35 μm, and is 8 μm in the present embodiment.

Then, the plating resist 32 is removed by chemical etching (wet etching) or stripping as shown in FIG. 4(f).

An exposed region of the thin metal film 31 is subsequently removed by etching as shown in FIG. 4(g). In this way, the wiring patterns 12 (FIG. 1 and FIG. 2) and the positioning marks PM1, PM2 (FIG. 1) composed of the thin metal films 31 and the conductor layers 33 are formed.

Next, electroless tin plating layers 34 are formed so as to cover the thin metal films 31 and the conductor layers 33 as shown in FIG. 4(h).

In this way, a long-sized circuit board 10 including the wiring patterns 12 and the positioning marks PM1, PM2 is formed.

Then, the solder resists SOL are formed by the screen printing so as to cover the predetermined regions of the mounting parts 11 (see FIG. 1 and FIG. 2) while the long-sized circuit board 10 is transported by the roll-to-roll system as shown in FIG. 5(i). Details of the screen printing will be described later.

Next, the sprocket holes 1S are formed on both sides of each of the mounting parts 11 (see FIG. 1) as shown in FIG. 5(j). Then, regions, below the mounting parts 11, of the long-sized board 30 are removed by etching as shown in FIG. 5(k). In this way, the tape carrier 1 for TAB shown in FIG. 1 is completed.

Finally, the tape carrier 1 for TAB is divided along the slit lines SL (see FIG. 1) into the four tape carriers.

(4) Method for Performing the Screen Printing

Figure 6:
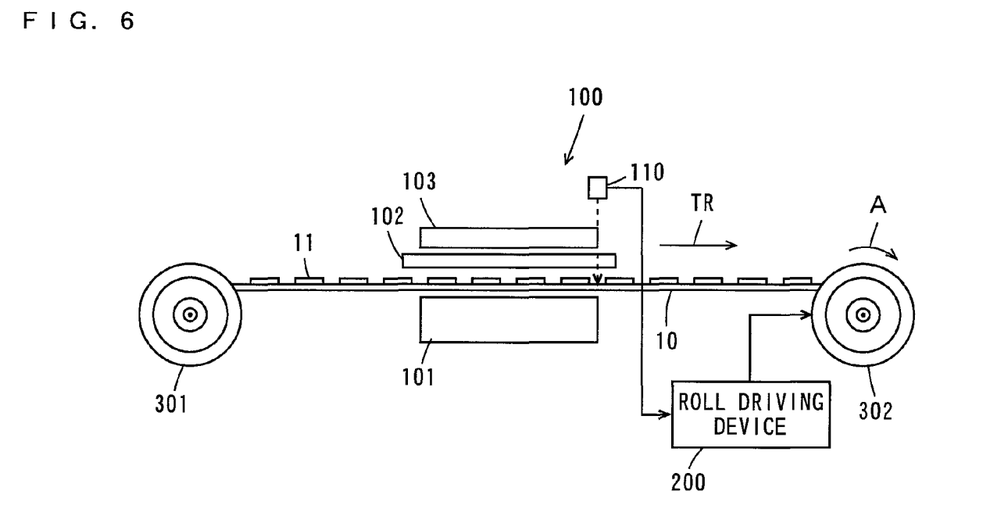
FIG. 6 is a schematic sectional view showing a method for performing screen printing by a roll-to-roll system.
Figure 7:
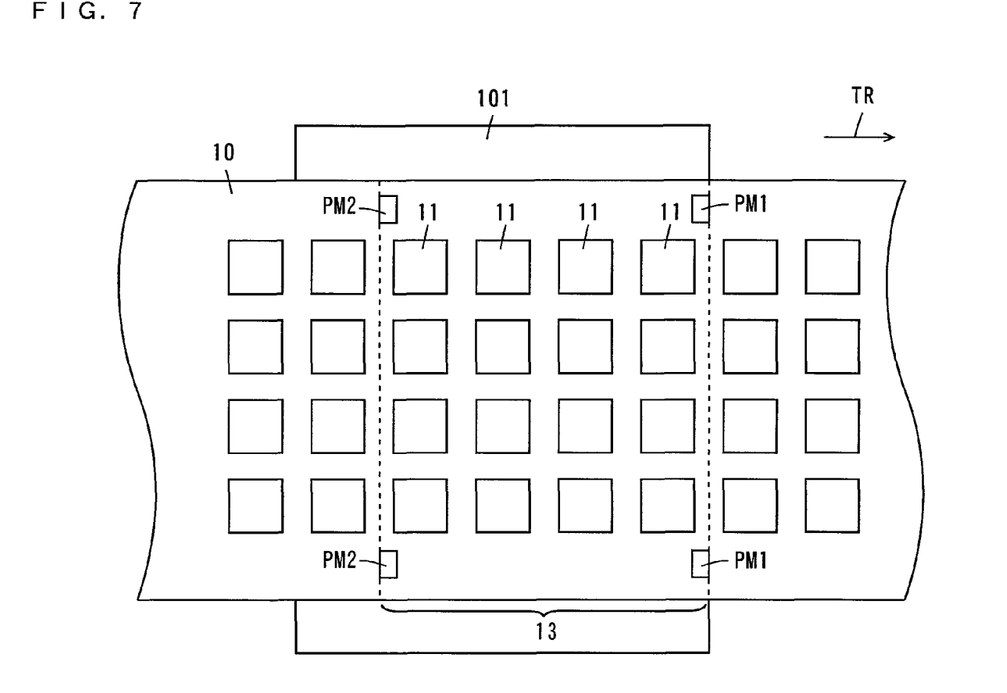
FIG. 7 is a schematic plan view showing a method for positioning a long-sized circuit board in the screen printing.

FIG. 6 is a schematic sectional view showing a method for performing the screen printing by the roll-to-roll system. FIG. 7 is a schematic plan view showing a method for positioning the long-sized circuit board 10 in the screen printing.

As shown in FIG. 6, the long-sized circuit board 10 is fed from a feeding roll 301 and wound into a winding roll 302. The winding roll 302 is rotated by a roll driving device 200 as indicated by the arrow A. Thus, the long-sized circuit board 10 is transported in the transportation direction TR.

A screen printing device 100 is arranged between the feeding roll 301 and the winding roll 302. The screen printing device 100 includes a printing stage 101, a screen plate 102 and a squeeze 103. The screen plate 102 has openings corresponding to regions, in which the solder resists are to be printed, in the printing block 13 of FIG. 1.

In the screen printing device 100, prints can be made in a region of the screen plate 102. Accordingly, the printing block 13 of the long-sized circuit board 10 is positioned below the screen plate 102, so that the screen printing can be performed to the printing block 13.

The printing stage 101 is arranged on the side of a lower surface of the long-sized circuit board 10 transported between the feeding roll 301 and the winding roll 302. The screen plate 102 is arranged above the printing stage 101 with the long-sized circuit board 10 sandwiched therebetween. An optical sensor 110 is arranged above a front end of the printing stage 101.

In the present embodiment, the optical sensor 110 is arranged so as to detect the positioning marks PM1 when respective one sides on the front end sides of the positioning marks PM1 coincide with a front edge of the printing stage 101 as shown in FIG. 7.

The optical sensor 110 is a reflection-type photoelectric sensor, for example, and detects the positioning marks PM1, PM2 by emitting light and receiving light reflected from the positioning marks PM1, PM2. Accordingly, a detection signal is output from the optical sensor 110.

The roll driving device 200 stops the winding roll 302 based on the detection signal from the optical sensor 110 when the optical sensor 110 detects the positioning marks PM1. Thus, the long-sized circuit board 10 is stopped in a state where the respective one sides on the front end sides of the positioning marks PM1 coincide with the front edge of the printing stage 101.

In the present embodiment, the optical sensor 110 outputs the detection signal when the positioning marks PM1, PM2 are detected. In this case, the detection signals in odd numbers output from the optical sensor 110 correspond to the detection of the positioning marks PM1, and the detection signals in even numbers output from the optical sensor 110 correspond to the detection of the positioning marks PM2. Accordingly, the roll driving device 200 stops the winding roll 302 in response to the detection signals in odd numbers output from the optical sensor 110.

After the long-sized circuit board 10 is stopped, the lower surface of the long-sized circuit board 10 is sucked onto the printing stage 101 while the screen plate 102 comes into contact with an upper surface of the long-sized circuit board 10. In this state, the squeeze 103 applies the solder resist onto the upper surface of the long-sized circuit board 10 through the openings formed in the screen plate 102 while moving in one direction. Thus, the solder resists SOL are formed in the predetermined regions of the plurality of mounting parts 11 in one printing block 13 of the long-sized circuit board 10.

Then, suction of the long-sized circuit board 10 onto the printing stage 101 is released and the roll driving device 200 drives the winding roll 302, so that the transportation of the long-sized circuit board 10 is resumed. The roll driving device 200 stops the transportation of the long-sized circuit board 10 when the optical sensor 110 detects the next positioning marks PM1. After this, the screen printing device 100 performs the screen printing of the solder resist to the next printing block 13.

The screen printing of the solder resist is sequentially performed to the plurality of printing blocks 13 on the long-sized circuit board 10 by repeating the above-described operations.

Note that when the optical sensor 110 is arranged above the rear end of the printing stage 101, the transportation of the long-sized circuit board 10 is stopped at the time of the detection of the positioning marks PM2 by the optical sensor 110. This allows each printing block 13 of the long-sized circuit board 10 to be positioned below the screen plate 102.

In case of transporting the long-sized circuit board 10 in a direction opposite to the direction of FIG. 7, the optical sensor 110 is arranged above the rear end of the printing stage 101, and the transportation of the long-sized circuit board 10 is stopped when the positioning marks PM2 are detected by the optical sensor 11. Also in this case, each printing block 13 of the long-sized circuit board 10 can be positioned below the screen plate 102.

(5) Effects of the Embodiment

According to the manufacturing method of the tape carrier 1 for TAB of the present embodiment, the screen printing of the solder resists is performed to the plurality of mounting parts 11 of each of the printing blocks 13 of the long-sized circuit board 10 while the printing block 13 is accurately positioned below the screen plate 102 of the screen printing device 100.

In this case, since the positioning marks PM1, PM2 are formed in the step of forming the long-sized circuit board 10, an increase in the number of the steps caused by forming the positioning marks PM1, PM2 is suppressed. In addition, the positioning marks PM1, PM2 can be formed in a small size because the positioning marks PM1, PM2 are used for detecting whether or not the printing block 13 corresponding thereto is positioned below the screen plate 102. This allows an area of the region in which the positioning marks PM1, PM2 are formed to be small, so that waste of the materials is suppressed.

As a result of these, the screen printing of the solder resist can be performed with high precision while the increase in the number of the steps and the waste of the materials are suppressed in the manufacture of the tape carrier 1 for TAB.

When the positioning marks PM1, PM2 of the long-sized circuit board 10 are positioned at the front end or the rear end of the printing stage 101, the printing block 13 is positioned below the screen plate 102. The positioning marks PM1, PM2 are detected in the vicinity of the screen printing device 100, so that the printing block 13 of the long-sized circuit board 10 can be positioned below the screen plate 102. Accordingly, the optical sensor 110 for detecting the positioning marks PM1, PM2 can be easily positioned.

Furthermore, the wiring patterns 12 made of a metal such as copper and the positioning marks PM1, PM2 are simultaneously formed on the base insulating layer BIL. Thus, the positioning marks PM1, PM2 can be easily formed on the long-sized circuit board 10 without increasing the number of the manufacturing steps of the tape carrier 1 for TAB. Moreover, since the positioning marks PM1, PM2 are made of a metal such as copper, reflection of light allows the positioning marks PM1, PM2 to be easily detected.

(6) Other Embodiments

While the positioning marks PM1 are arranged such that each printing block 13 of the long-sized circuit board 10 coincides with the printing stage 101 when the respective one sides on the front end sides of the positioning marks PM1 coincide with the front edge of the printing stage 101 as shown in FIG. 7 in the above-described embodiment, the present invention is not limited to this.

Figure 8:
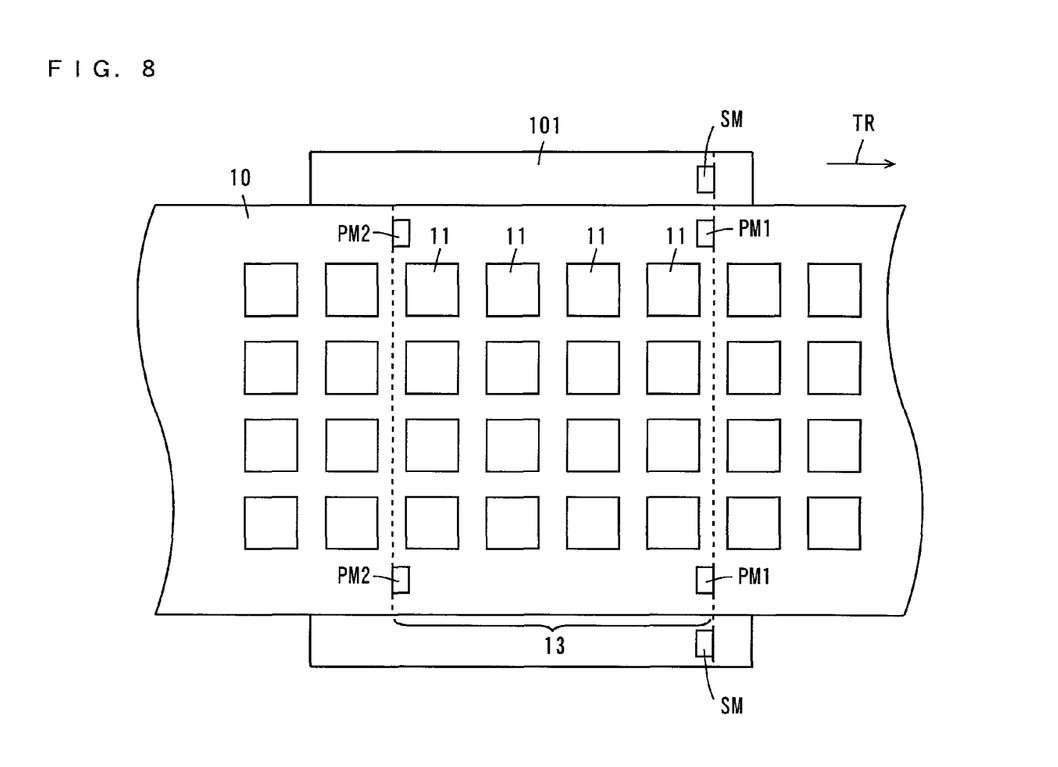
FIG. 8 is a schematic plan view showing another example of an arrangement of positioning marks.

FIG. 8 is a schematic plan view showing another example of the arrangement of the positioning marks PM1, PM2. In the example of FIG. 8, reference marks SM are provided in the vicinity of both lateral sides of the upper surface of the printing block 13. In this case, the positioning marks PM1 are arranged so that the printing block 13 of the long-sized circuit board 10 is positioned below the screen plate 102 when the positioning marks PM1 are adjacent to the reference marks SM of the printing stage 101.

While the positioning marks PM1, PM2 are formed in a quadrangular shape in the above-described embodiment, the shape of the positioning marks PM1, PM2 are not limited to this.

Figure 9:
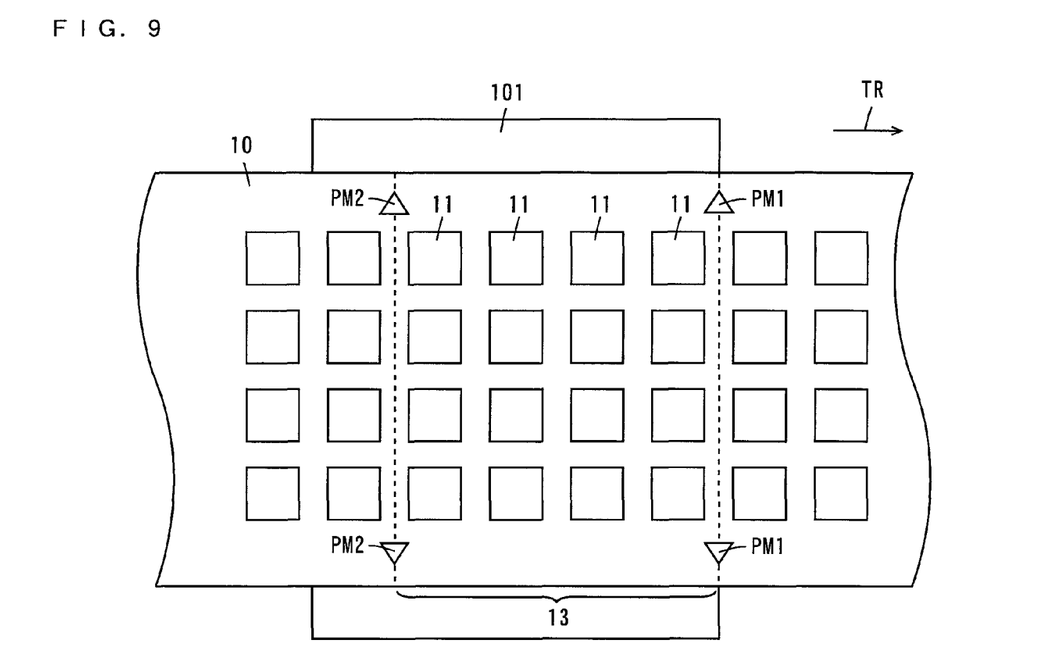
FIG. 9 is a schematic plan view showing another example of a shape of the positioning marks.

FIG. 9 is a schematic plan view showing another example of the shape of the positioning marks PM1, PM2.

In the example of FIG. 9, the positioning marks PM1, PM2 are formed in a triangular shape. In this case, one vertex of each of the triangles is directed outward in the width direction. The positioning marks PM1 are arranged so that each printing block 13 of the long-sized circuit board 10 is positioned below the screen plate 102 when the outward vertices of the positioning marks PM1 coincide with the front edge of the printing stage 101.

A length of one side, in the transportation direction TR, of the triangular positioning mark PM is not less than 1 mm and not more than 5 mm, for example, and is preferably not less than 1 mm and not more than 3 mm. A length of the triangular positioning mark PM in the width direction is not less than 1 mm and not more than 5 mm, for example.

Only the positioning marks PM1 that are adjacent to the front end side, in the transportation direction TR, of each printing block 13 of the long-sized circuit board 10 may be provided. Moreover, only the positioning marks PM2 that are adjacent to the rear end side, in the transportation direction TR, of each printing block 13 of the long-sized circuit board 10 may be provided. Furthermore, the positioning marks PM1, PM2 may be formed in the vicinity of only one lateral side of the long-sized circuit board 10.

The wiring patterns 12 and the positioning marks PM1, PM2 may be formed by another method such as a subtractive method, not limited to the semi-additive method.

The positioning mark PM1 may be provided in the vicinity of only one lateral side close to the front end of each printing block 13 in the transportation direction TR of the long-sized circuit board 10. In addition, the positioning mark PM2 may be provided in the vicinity of only one lateral side close to the rear end of each printing block 13 in the transportation direction TR of the long-sized circuit board 10.

A material for the long-sized board 30 is not limited to stainless-steel. For example, other metal materials such as copper and nickel can be used.

A material for the base insulating layer BIL is not limited to polyimide. For example, other resin materials such as polyester, polyethylene terephthalate, polyethernitrile and polyethersulphone may be used.

A material for the wiring patterns 12 is not limited to copper. For example, other metal materials such as copper alloy, gold and aluminum may be used.

A material for the solder resist SOL is not limited to polyimide. For example, other resin materials such as polyester, polyethylene terephthalate, polyethernitrile and polyethersulphone may be used.

The wiring patterns 12 and the positioning marks PM1, PM2 may be formed by using a two-layer base material such as a copper laminated plate.

(7) Correspondences Between Elements in the Claims and Parts in Embodiments

In the following paragraph, non-limiting examples of correspondences between various elements recited in the claims below and those described above with respect to various embodiments of the present invention are explained.

In the above-described embodiments, the base insulating layer BIL is an example of an insulating layer, the mounting part 11 is an example of a mounting part, the wiring pattern 12 is an example of a wiring pattern, the conductor layer 33 is an example of a conductor layer, the long-sized circuit board 10 is an example of a long-sized circuit board, the printing block 13 is an example of a unit region, the solder resist SOL is an example of a solder resist, the screen printing device 100 is an example of a screen printing device, the printing stage 101 is an example of a printing stage, and the screen plate 102 is an example of a screen plate.

As each of various elements recited in the claims, various other elements having configurations or functions described in the claims can be also used.

Inventive Example

The long-sized circuit board 10 was prepared according to the manufacturing method of the above-described embodiments. The width of the long-sized circuit board 10 was 300 mm, and the thickness thereof was 68 µm. The plurality of printing blocks 13 were provided at intervals of 285 mm in the longitudinal direction in the long-sized circuit board 10. A total of 72 mounting parts 11 constituted by 6 pieces in the width direction and 12 pieces in the longitudinal direction were included in each printing block 13. A length of one side, in the longitudinal direction of the long-sized circuit board 10, of each mounting part 11 was 47.5 mm, and a length of one side, in the width direction of the long-sized circuit board 10, of each mounting part 11 was 48 mm.

The positioning marks PM1, PM2 were formed in positions inwardly spaced apart from the both lateral sides of the long-sized circuit board 10 by 2 mm so as to be adjacent to the front end and the rear end of each printing block 13 of the long-sized circuit board 10.

A length of one side, in the longitudinal direction of the long-sized circuit board 10, of each of the positioning marks PM1, PM2 was 1 mm, and a length of one side, in the width direction of the long-sized circuit board 10, of each of the positioning marks PM1, PM2 was 2 mm.

As shown in FIG. 7, the long-sized circuit board 10 was transported by the roll-to-roll system, and the transportation of the long-sized circuit board 10 was stopped when it was detected that the respective one sides on the front ends of the first positioning marks PM1 coincided with the front edge of the printing stage 101.

After the transportation of the long-sized circuit board 10 was stopped, the screen plate 102 of the screen printing device 100 was set at the upper surface of the long-sized circuit board 10, and the solder resist was formed in each mounting part 11 of the first printing block 13 by the screen printing.

Next, the transportation of the long-sized circuit board 10 was resumed, and then stopped when it was detected that the one sides on the front ends of the next positioning marks PM1 coincided with the front edge of the printing stage 101. Then, the solder resist was similarly formed in each mounting part 11 of the next printing block 13 by the screen printing.

Although the above-described steps of detecting positioning marks PM1, stopping the transportation of the long-sized circuit board 10 and performing the screen printing are successively repeated 300 times, printing defects such as deficient print did not occur in each printing block 13.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A manufacturing method of a tape carrier for tape automated bonding (TAB), comprising the steps of:

forming a long-sized circuit board by forming a plurality of mounting parts each including a wiring pattern on a long-sized insulating layer; and forming a solder resist in a predetermined region of the wiring pattern in each of the mounting parts for each unit region including a predetermined number of mounting parts of said long-sized circuit board by using a screen printing device while transporting said long-sized circuit board by a roll-to-roll system, the screen printing device including a printing stage set at a back surface of said insulating layer of said long-sized circuit board and a screen plate set at a surface on a side of said plurality of mounting parts of said long-sized circuit board which is opposite to said printing stage, such that said long-sized circuit board is sandwiched between said printing stage and said screen plate, wherein said step of forming said long-sized circuit board includes a step of forming a positioning mark, corresponding to each unit region, in a region along at least one lateral side in a longitudinal direction on said long-sized circuit board, the step of forming the positioning mark including providing each positioning mark such that the unit region corresponding to the positioning mark is positioned below said screen plate when the positioning mark is positioned at a predetermined portion of said printing stage in the transportation direction of said long-sized circuit board, a region where said screen printing device can make prints is a region below said screen plate, and said step of forming the solder resist includes a step of detecting that the unit region corresponding to the positioning mark is positioned in a region where said screen printing device can make prints by detection of the positioning mark during transportation of said long-sized circuit board, a step of stopping the transportation of said long-sized circuit board in response to said detection of the positioning mark, a step of performing screen printing of the solder resist by said screen printing device to said unit region corresponding to the positioning mark in said long-sized circuit board that has been stopped, and a step of resuming the transportation of said long-sized circuit board after said screen printing.

2. The manufacturing method of the tape carrier for TAB according to claim 1, wherein said step of forming the positioning mark includes providing each positioning mark on at least one side of each unit region in a width direction of said long-sized circuit board.

3. The manufacturing method of the tape carrier for TAB according to claim 1, wherein said predetermined portion is at least one of a front end and a rear end of said printing stage.

4. The manufacturing method of the tape carrier for TAB according to claim 1, wherein said step of detecting includes optically detecting each positioning mark.

5. The manufacturing method of the tape carrier for TAB according to claim 1, wherein said step of forming said long-sized circuit board includes simultaneously forming the wiring pattern and the positioning mark that are composed of a conductor layer on said insulating layer.

\* \* \* \* \*